(12) United States Patent
Dao et al.

(10) Patent No.: US 6,279,249 B1
(45) Date of Patent: Aug. 28, 2001

(54) REDUCED PARTICLE CONTAMINATION MANUFACTURING AND PACKAGING FOR RETICLES

(75) Inventors: Giang T. Dao, Fremont; Ronald J. Kuse, San Jose, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/477,795

(22) Filed: Dec. 30, 1999

(51) Int. Cl.$^7$ ........................................... F26B 19/00
(52) U.S. Cl. ........................ 34/61; 34/72; 34/202; 34/210; 34/236
(58) Field of Search ............... 34/380, 381, 389, 34/391, 404, 405, 406, 410, 417, 442, 516, 60, 61, 72, 202, 210, 212, 218, 219, 236; 414/217, 904; 118/708, 725, 728

(56) References Cited

U.S. PATENT DOCUMENTS

| | | | |
|---|---|---|---|
| 5,351,415 | * 10/1994 | Brooks et al. | 34/389 |
| 5,628,121 | * 5/1997 | Brooks et al. | 34/61 |
| 5,724,748 | * 3/1998 | Brooks et al. | 34/90 |
| 5,815,947 | * 10/1998 | Brooks et al. | 34/389 |
| 6,067,727 | * 5/2000 | Muraoka | 34/317 |
| 6,161,311 | * 12/2000 | Doely et al. | 34/548 |

OTHER PUBLICATIONS

Aeron Chair brochure by Herman Miller, Inc., 1998.*

* cited by examiner

*Primary Examiner*—Stephen Gravini
(74) *Attorney, Agent, or Firm*—Blakely, Sokoloff, Taylor & Zafman LLP (57) ABSTRACT

A method of transporting a reticle is disclosed. The reticle is placed in a reticle carrier that has an ionizer. Moreover, the reticle may be attached with a pellicle. The pellicle consists of a pellicle frame and a pellicle film stretched over the pellicle frame. The pellicle frame has included within an absorbent material.

3 Claims, 8 Drawing Sheets

REDUCED PARTICLE CONTAMINATION MANUFACTURING AND PACKAGING FOR RETICLES

BACKGROUND OF THE INVENTION

1. Field of the Invention

The present invention relates to photolithography of semiconductor devices, and more particularly, to a method of making and packaging reticles resulting in reduced particle contamination.

2. Background Information

Photolithography is a process that is commonly used in the manufacture of integrated circuits. The process involves the deposition of a photoresist layer onto an underlying substrate layer. The photoresist is then selectively exposed to light, which chemically alters the photoresist. The photoresist is then developed and those portions of the photoresist that are exposed to light are either hardened or softened, depending upon whether or not the photoresist is negative or positive photoresist, respectively.

The pattern that is projected onto the photoresist layer is contained on a mask that is placed within the photolithography exposure tool. A mask, also referred to as a reticle, is placed between the illuminating light and the photoresist. The reticle is typically formed from patterned chromium placed on glass or quartz. The pattern is transferred onto the photoresist by projecting an image of the reticle onto the photoresist using an exposing radiation.

In many applications, the reticle is covered by a pellicle. A pellicle is a thin film of optical grade polymer that is stretched on a frame and secured to the reticle. The pellicle's purpose is to prevent airborne dirt from collecting on the mask and acting as an opaque spot. During the exposure, the dirt is held out of the focal plane and does not print on the wafer.

With the need for smaller critical dimensions, photolithography technology has evolved into using extreme ultraviolet (EUV) exposure radiation that has a smaller wavelength. One wavelength that is becoming popular is 157 nm. Unfortunately, current pellicles are formed from a material that are either not sufficiently transparent to radiation at 157 nm or does not have sufficient durability under these process conditions. Therefore, in many applications, reticles are manufactured without pellicles. This causes increased risk to contamination of the reticle.

Moreover, after the reticle has been manufactured, the reticle must be transported from the manufacturer to the semiconductor fabrication facility (known as a "fab"). This transport process increases the risk of contamination. Currently, reticles are stored and shipped in reticle containers without any devices specifically designed to remove particles from the environment in which they are enclosed.

SUMMARY OF THE INVENTION

A method of transporting a reticle is disclosed. The reticle is placed in a reticle carrier that has an ionizer.

BRIEF DESCRIPTION OF DRAWINGS

The present invention will be described in conjunction with the following Figures, wherein.

DETAILED DESCRIPTION OF THE INVENTION

The present invention offers a way to purify the environment in a reticle carrier to prevent contamination. In accordance with the present invention, the reticle carrier includes an ionizer that produces ions. Because particles and other contaminents often hold a net electrical charge allowing electrostatic forces to attract and hold particles to the surface of the reticle, the ions act to neutralize the contaminants within the reticle carrier. This prevents the contaminants from adhering to reticle surfaces, and thus mitigating the need for a pellicle.

Specifically, as a means to prevent particles from collecting on pellicle-less mask surfaces, the mask is cleaned and inspected for pattern fidelity, hard defects, and soft defects, including particles and contamination. The mask is placed in a super clean mini-environment pod, such as a standard mechanical interface (SMIF) pod. The SMIF pod is a self contained, portable mini-environment that surrounds semiconductor production wafers and minimizes exposure to contaminants that could adversley affect chip performance and yield. The above steps are all conventionally performed in the prior art.

Figure 1:
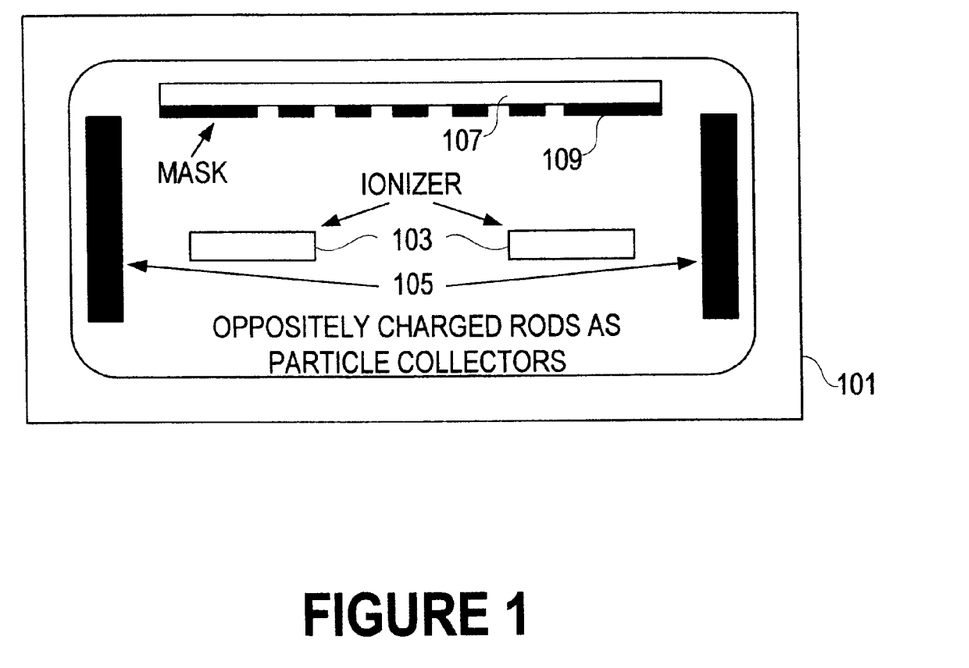
FIG. 1 is a schematic diagram illustrating a pellicle carrier formed in accordance with the present invention.

However, in accordance with the present invention, the SMIF pod is modified to include an ionizer that generates ions for neutralizing charged contaminants. Specifically, turning to FIG. 1, a SMIF pod 101 is shown. The SMIF pod 101 includes an ionizer 103, a pair of oppositely charged particle collectors 105, and a reticle 107. The ionizer 103 generates ions that will neutralize contaminants within the SMIF pod 101. Moreover, the particle collectors 105 are oppositely charged. This results in the contaminants being attracted to one or the other of the particle collectors 105. Note that in FIG. 1, the reticle 107 is preferably placed with the chromium side 109 down to prevent particles from landing on the particle sensitive side of the reticle.

Figure 2:
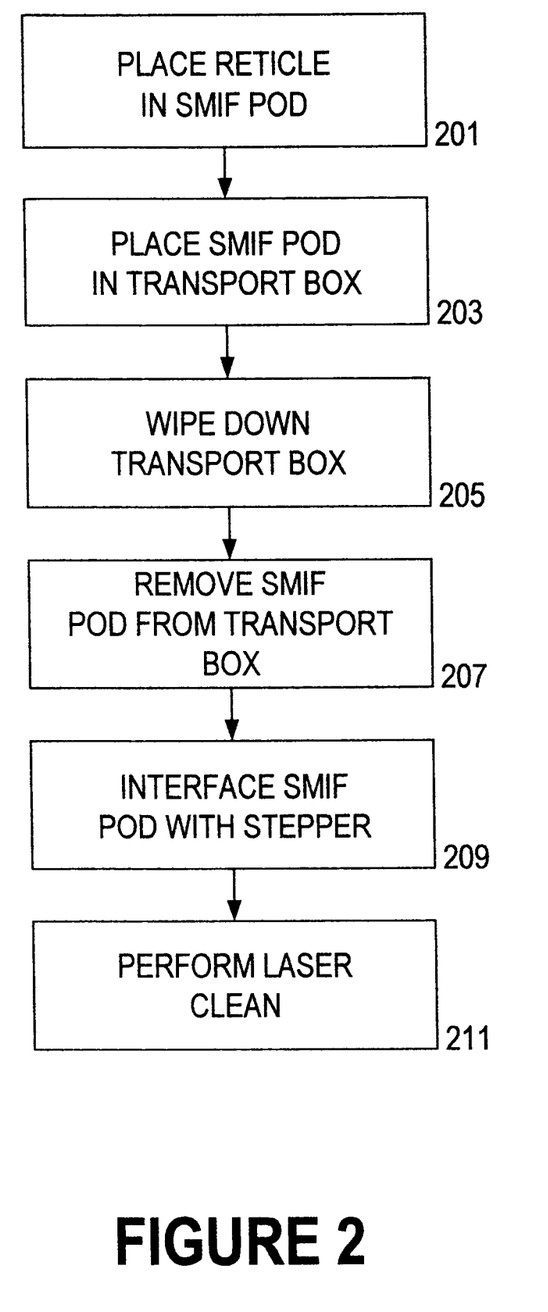
FIG. 2 shows a flow diagram illustrating the steps of handling a reticle in accordance with the present invention.

The entire process of handling the manufactured reticle is shown in FIG. 2. First, at box 201, the reticle is placed faced down into the SMIF pod 101. Next, at box 203, the SMIF pod 101 is subsequently placed in a transport box while still inside the clean room. The transport box is then shipped to outside wafer fabs. Upon arrival at the wafer fab, at box 205, the transport box is wiped down per standard cleaning protocols and moved to inside the clean room. At box 207, the mini-environment SMIF pod 101 is removed from the transport box and either moved to the lithography tools if needed immediately for wafer production or into storage if not.

When the reticle is required, at box 209, the SMIF pod 101 is interfaced directly with the lithography tool so that the reticle is never exposed directly to factory ambient air. Automatic transfer and loads of the reticle is done into the photolithography stepper. Finally, at box 211, in situ laser cleaning is performed prior to wafer exposure to remove adsorbed substances. The light source may be either the one used to expose the wafers or a separate source.

In accordance with the other aspects of the present invention, a method is provided for removing transmission inhibiting chemical species during the manufacturing process of the reticle. Typically, optical contaminants exist adsorbed on the reticle and pellicle surfaces, in gas phase in the space between the reticle and the pellicle, or both. In a conventional reticle manufacturing process, a pellicle is mounted on the patterned side of the reticle to protect it from contamination. This mounting process is invariably performed in a clean room environment to prevent particles from being introduced into the process.

Because the mounting process is performed in atmospheric air, the gas space between the pellicle and reticle (hereinafter referred to as the "interpellicle space") will contain air. Common atmospheric substances include carbon and oxygen containing species such as $O_2$, $CO_2$, and $H_2O$, which are known to inhibit the transmission of radiation having wavelengths commonly used in the photolithography process, such as 157 nm. These species may exist: (1) in the gas phase in the interpellicle space, (2) adsorbed on the reticle surface, including either the substrate or thin film surfaces, (3) adsorbed on and absorbed in the pellicle, (4) or adsorbed on the pellicle frame surfaces.

The transmission of 157 nm wavelength radiation can be reduced by the presence of even monolayer quantities of such chemical species. Removal of these species or substitution of these species with other materials which do not absorb the exposing radiation wavelength is therefore required for photolithographic processes, especially those in the extreme ultra-violet region and below.

Therefore, what is provided is a method for mounting a pellicle onto a reticle under an optically inert gas environment. The completed reticle can then be transferred to a photolithography tool. The method described herein is not dependant upon the gas environment used and therefore can be applied with a variety of substances. Preferably, the gas environment should be optically inert to the exposing radiation wavelength.

Figure 3:
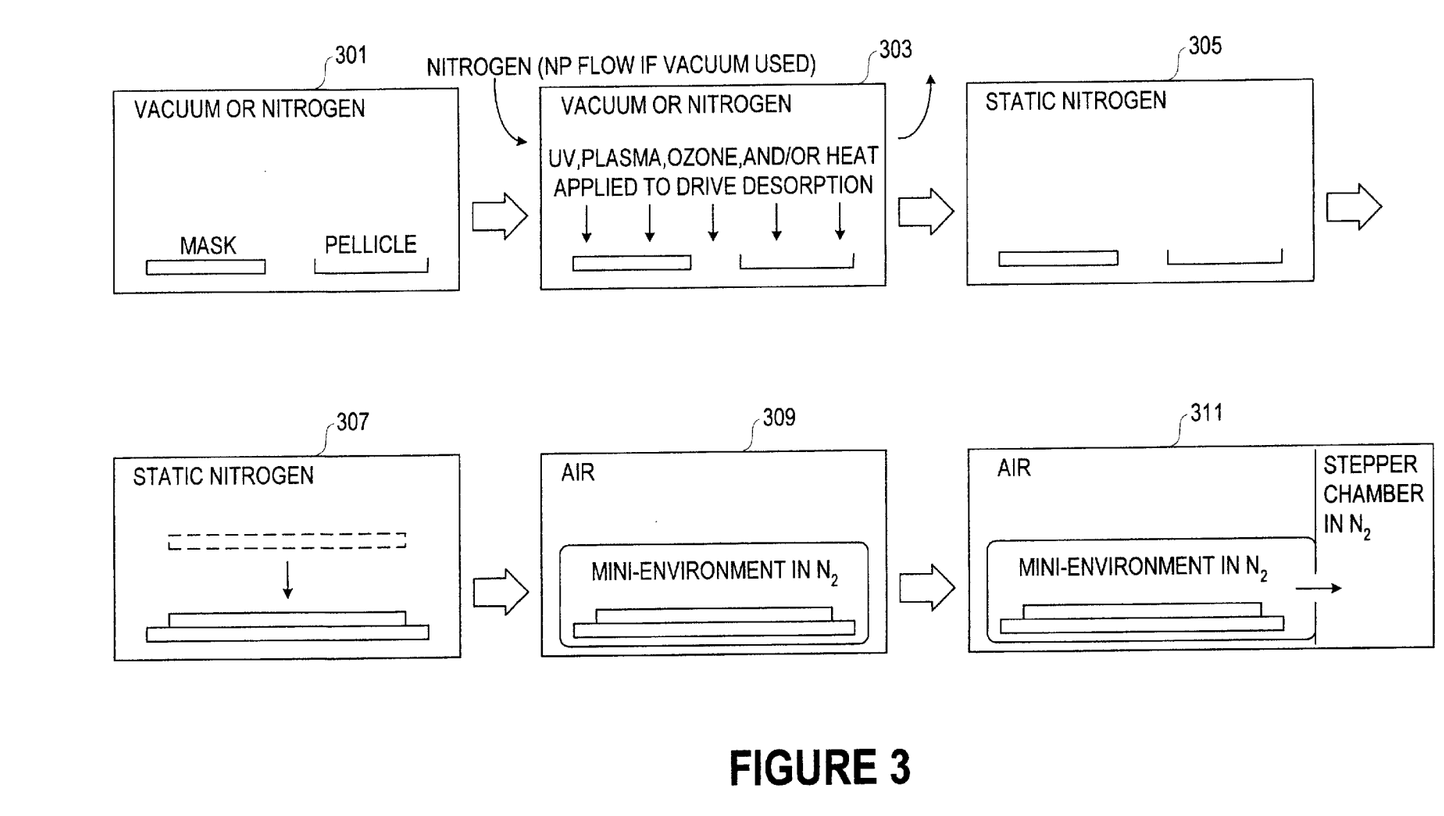
FIG. 3 shows a flow diagram illustrating the steps of mounting a pellicle onto a reticle in accordance with the present invention.

In accordance with the present invention, referring to FIG. 3, after the reticle has been patterned, cleaned, and its quality verified to specification requirements, the reticle (referred to as a mask in FIG. 3) is transferred into a process chamber with a pellicle at step 301. The chamber is evacuated and maintained at vacuum or filled with an optically inert gas (such as nitrogen) at approximately atmospheric pressure (plus or minus 50 psi). By optically inert gas, it is meant a gas that has minimal or negligible effect on the transmission of radiation at the wavelength of the exposure radiation used in the photolithography stepper. Next, at step 303, the mask and pellicle surfaces are then exposed to either (1) UV radiation, (2) plasma, (3) ozone, (4) heat, or (5) a combination of the above. This exposure will remove adsorbed and absorbed species. In other words, the treatment will drive desorption. If an optically inert gas is used rather than vacuum, it is flowed during this process to carry away desorbed substances. The optically inert gas, such as nitrogen, may also be heated to accelerate the desorption process.

The time of exposure at step 303 will depend upon the final exposure radiation transmission level required, the exposure option used, the pellicle material chosen, the gas flow rate or vacuum pressure, the convective mass transfer coefficient (if gas is used), and the species adsorbed and absorbed on the incoming photo mask. When the targeted exposure time is reached, the treatment of step 303 (of the UV radiation, plasma, ozone, heat, etc.) is discontinued. The gas flow or vacuum maybe simultaneously discontinued or allowed to continue for a period of time. The exact operating process and its optimization would depend on the equipment geometry, materials, flow path and other design perimeters.

Next, at step 305, once the target exposure time is reached, the chamber is filled with an optically inert gas (if vacuum was used in steps 301 and 303) or the gas flow is stopped (if optically inert gas was used). Next, at step 307, robotic systems mount the pellicle either in situ or after automated transfer to another station (all under an optically inert gas environment).

The assembled reticle is moved to a particle inspection tool either through a mini-environment pod (such as a SMIF pod) or through a robotic transfer system. In either case, the reticle is maintained in an optically inert environment. As an option, the particle inspection step can be skipped, provided that the risk of particle contamination is sufficiently low.

At step 309, the reticle is maintained in an optically inert gas atmosphere during subsequent storage and shipping by means of mini-environment SMIF pods. As seen in step 311, loading onto photolithographic tools can be achieved by use of robotics systems which transfer the reticle from the pod to the tool and serve as an interface which maintains the optically inert gas environment surrounding the photo mask.

Figure 4A:
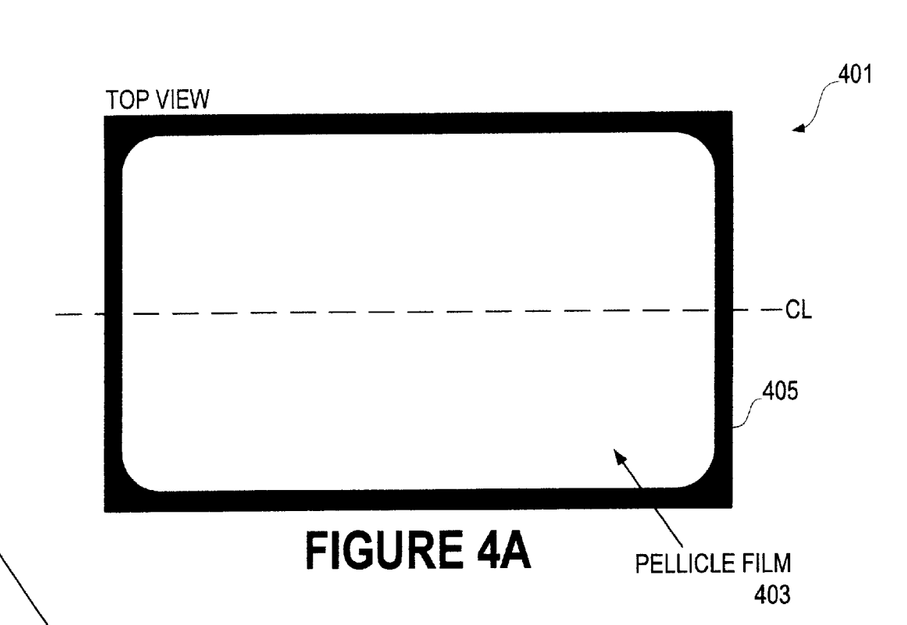
FIGS. 4a–c show schematic diagrams of a pellicle formed in accordance with the present invention.
Figure 4B:
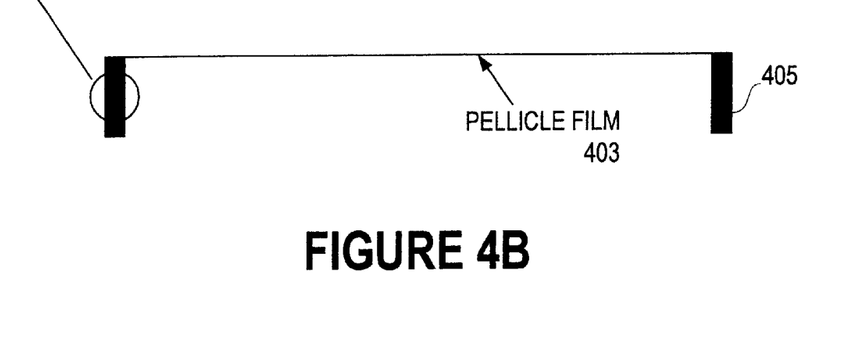
Figure 4C:
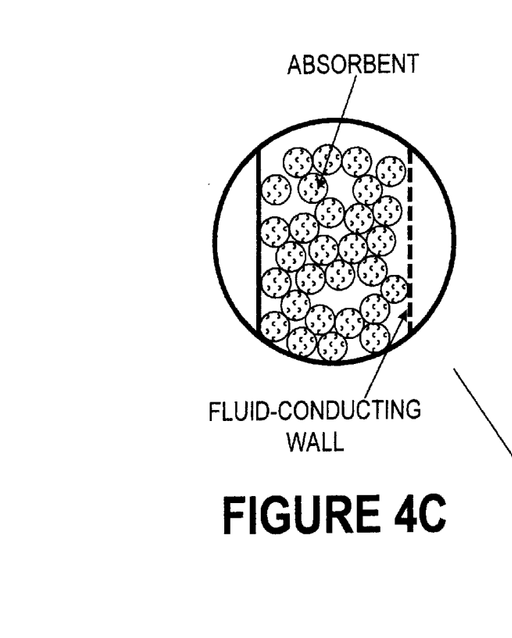

As an additonal protection against transmission inhibiting compounds, polar and hydrogen bonding absorbance can be embedded in the pellicle frame to act as a scavenger for any traces of unwanted gases. Turning to FIGS. 4a–c, a design for a pellicle along these lines is shown.

As seen in FIGS. 4a–c, the pellicle 401 includes a pellicle frame 405 and a pellicle film 403. The pellicle film 403 is stretched over the pellicle frame 405. The frame is filled with an absorbent material. The absorbent material may be one of the well known polar and hydrogen bonding absorbent materials. The absorbent may be present in one or all sides of the pellicle frame. The absorbent acts as a scavenger for any traces of unwanted gases. Note that the shape and packing density shown in FIG. 4c is only for illustrative purposes. Note that the interior or exterior frame wall may be constructed or coated with a solid adsorbent material as well.

The above description provides an improved method for manufacturing and attaching the pellicle to the reticle. For some applications, the reticle has already been attached to a pellicle. Even for these situations, the present invention provides a method for purifying these "pre-made" pellicle/reticle combinations. By purifying, it is meant the removal of the interpellicle air and substitution with an optically inert gas.

There will be described three different methods for substituting the air in the interpellicle space with an optically inert gas. The methods described here are not dependant on the gas used and therefore can be applied with a variety of substances at the users discretion.

Figure 5:
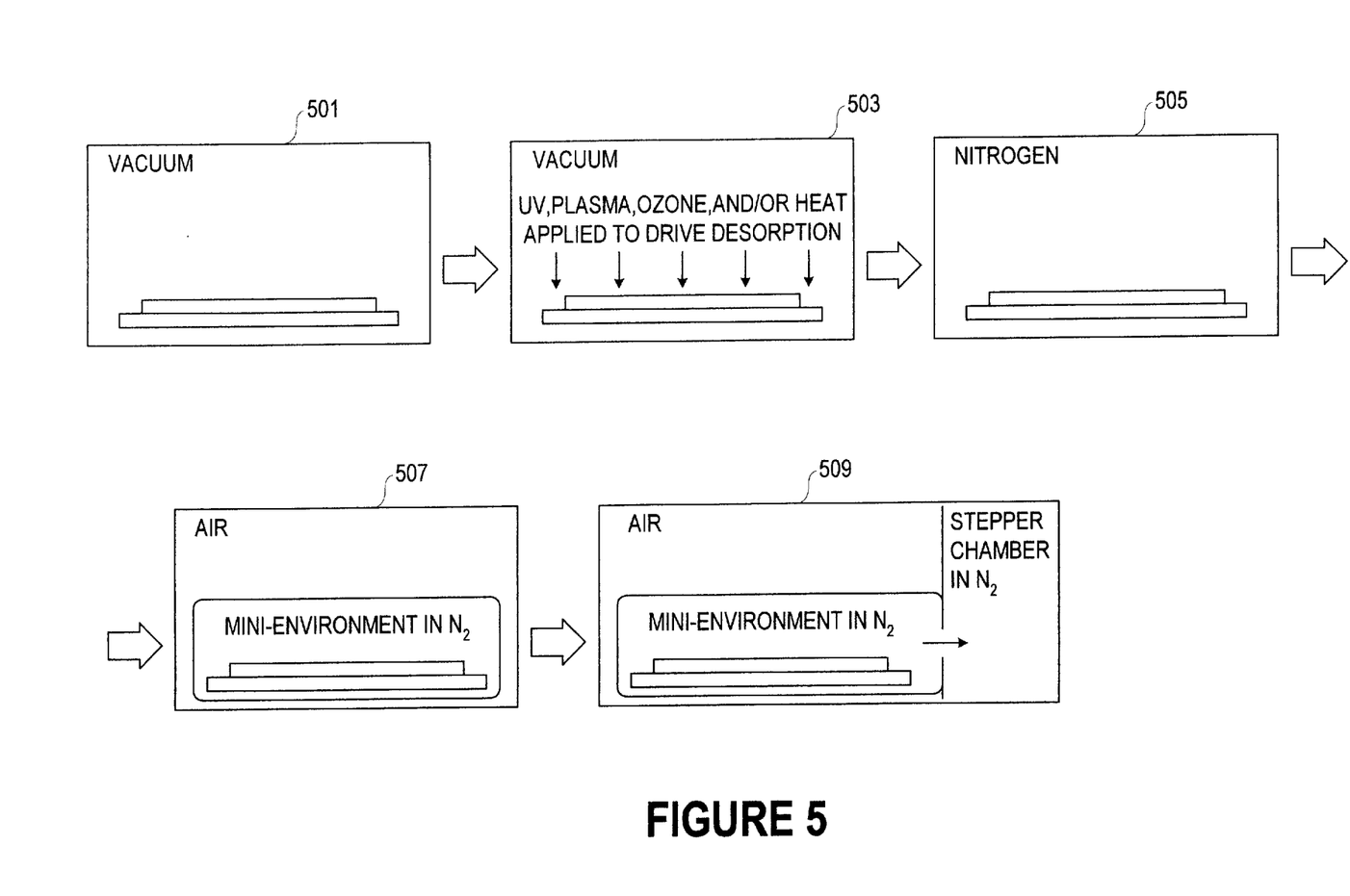
FIG. 5 shows a flow diagram illustrating the steps of modifying a reticle and pellicle combination in accordance with the present invention.

Referring to FIG. 5, the first method is referred to as the "vacuum assisted removal" technique. After the reticle has been attached to the pellicle and all of the manufacturing and inspection steps have been completed, at step 501, the reticle (attached with a pellicle and referred to as "pelliclized") is transferred to a process chamber that has been evacuated. Evacuation of the interpellicle gas during vacuum pump down relies on a pressure release valve (PRV) as a fluid conduit. The PRV is normally integrated into current pellicle frames to equalize ambient pressure with the pressure in the interpellicle space. The size, number, and placement of PRV's may be changed from existing configurations to accommodate this new evacuation function. The PRV may be as simple as a single small orifice in the frame.

After a suitable vacuum has been achieved, at step 503, the pelliclized reticle is exposed to either ultra violet radiation, plasma, ozone, heat, or a combination of the above to remove the adsorbed and absorbed species. The vacuum is augmented with UV or these other methods to drive desorption and removal of contaminents. The time of exposure will depend on the final transmission level required and other factors noted above. This step 503 is similar to step 303 described above.

Next, at step 505, once the target exposure time is reached, the chamber is filled with an optically inert gas, such as nitrogen, until atmospheric pressure is reached. The rate of the gas fill will be dependent on the rate that the PRV devices allow gas to enter the interpellicle space. Next, at step 507, the pelliclized reticle is moved into a mini-environment pod (such as a SMIF pod) through a robotic transfer system. In either case, the reticle is maintained in an optically inert environment.

At step 509, the reticle is maintained in an optically inert gas atmosphere during subsequent storage and shipping by means of mini-environment SMIF pods. As seen in step 509, loading onto photolithographic tools can be achieved by use of robotics systems which transfer the reticle from the SMIF pod to the tool and serve as an interface which maintains the optically inert gas environment surrounding the reticle.

Figure 6:
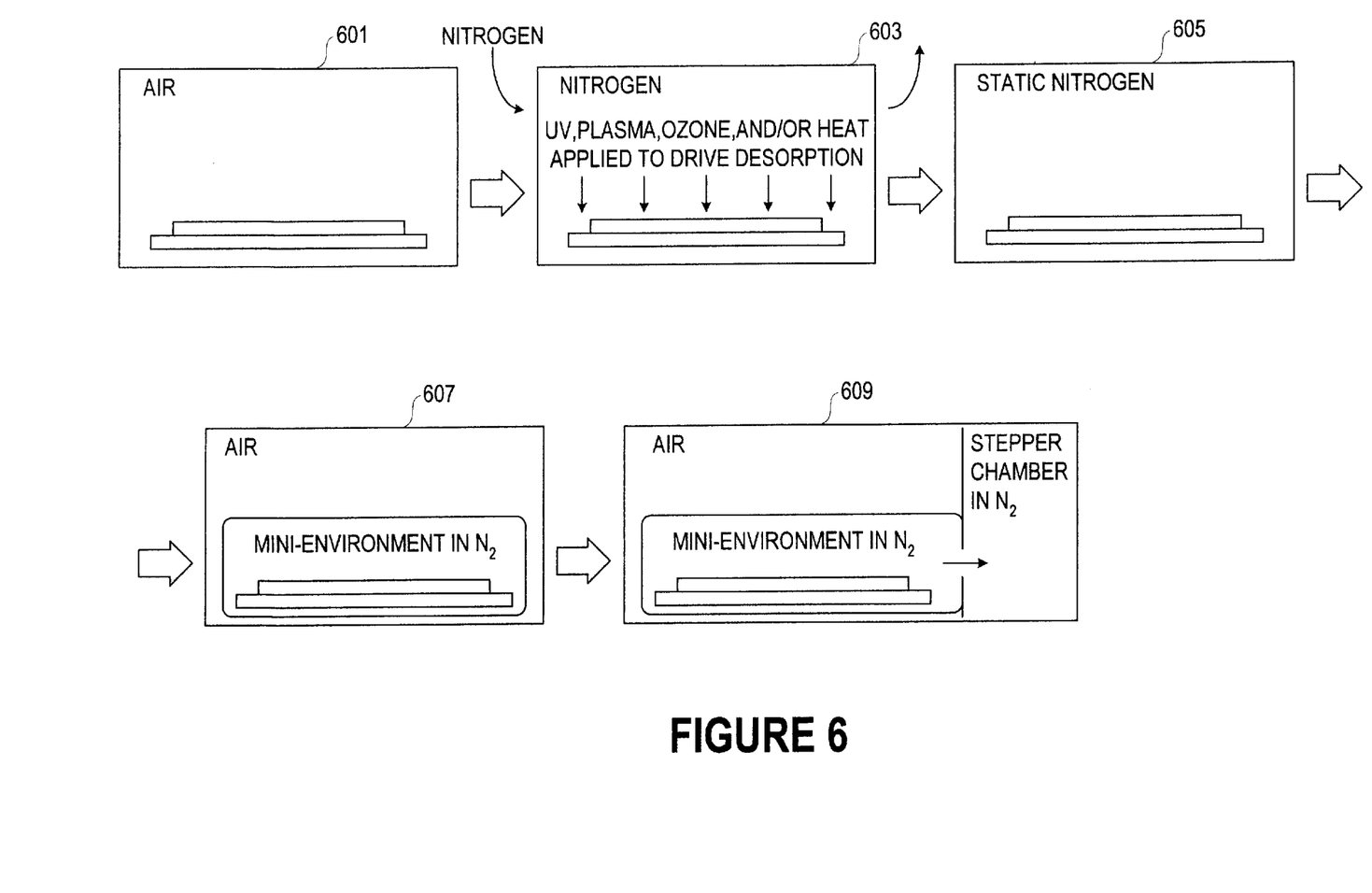
FIG. 6 shows a flow diagram illustrating the steps of modifying a reticle and pellicle combination in accordance with an alternative embodiment of the present invention.

In the second embodiment referred to as "passive removal" and shown in FIG. 6, after the reticle has been pelliclized and completed all of its manufacturing and inspection steps at step 601, it is transferred to a process chamber at step 603 where it is exposed to a continuous flow of optically inert gas and either UV radiation, plasma, ozone, heat, or a combination of the above. The flowing gas creates a chemical potential gradiant of the transmission inhibiting compounds across the reticle/gas phase interface to drive mass transfer. The chemical potential gradiant is augmented with ultra-violet or other means to drive desorption and removal of contaminents. To accelerate the desorption kinetics, the gas also may be heated to a higher temperature prior to chamber introduction. Like the above methods, the time of exposure will depend on various factors discussed above.

Next, at step 605, once the target exposure time is reached, the chamber is filled with an optically inert gas, such as nitrogen, until atmospheric pressure is reached. Next, at step 607, the pelliclized reticle is moved into a mini-environment pod (such as a SMIF pod) through a robotic transfer system. In either case, the reticle is maintained in an optically inert environment.

At step 609, the reticle is maintained in an optically inert gas atmosphere during subsequent storage and shipping by means of mini-environment SMIF pods. As seen in step 609, loading onto photolithographic tools can be achieved by use of robotics systems which transfer the reticle from the SMIF pod to the tool and serve as an interface which maintains the optically inert gas environment surrounding the reticle.

Figure 7:
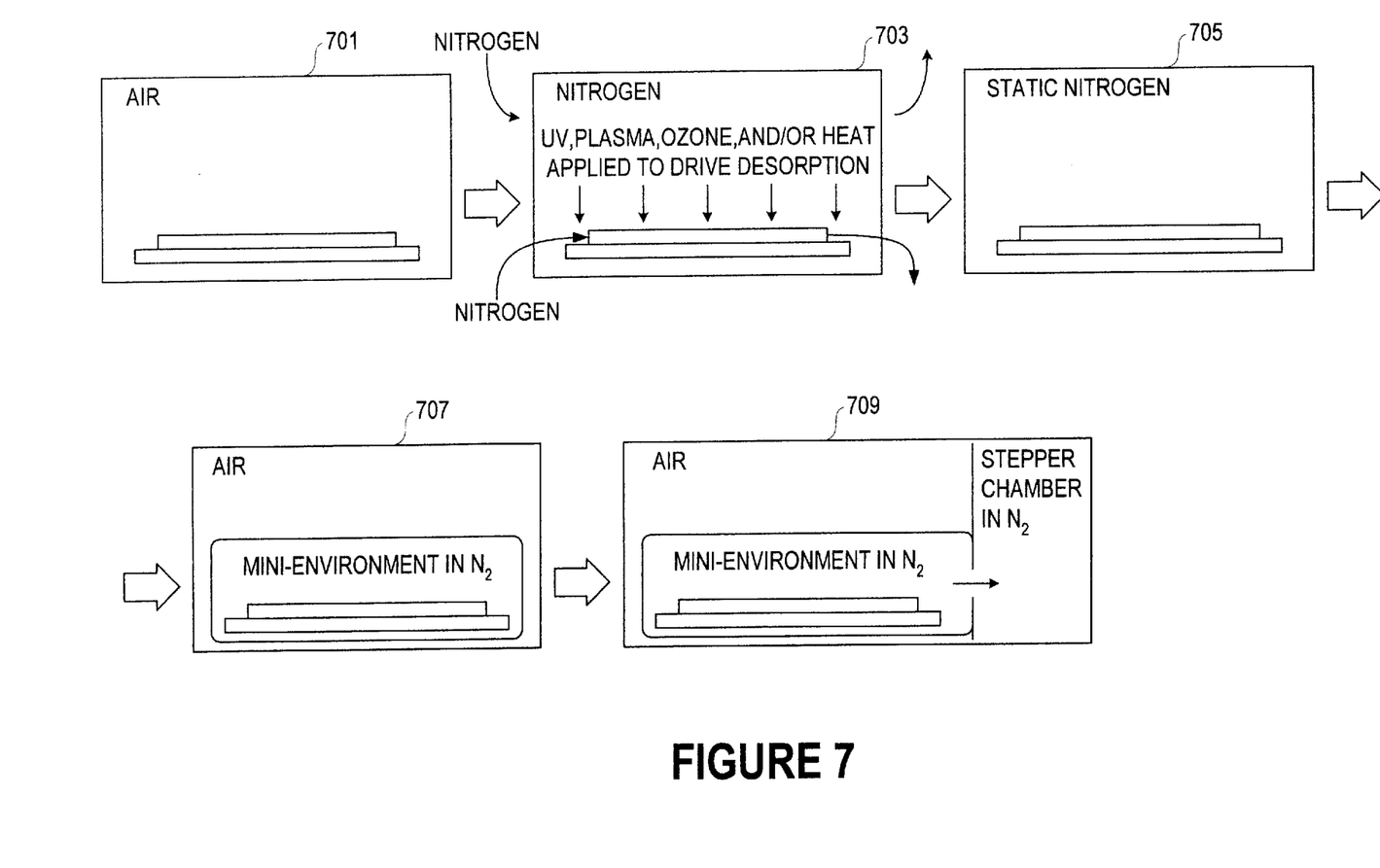
FIG. 7 shows a flow diagram illustrating the steps of modifying a reticle and pellicle combination in accordance with another alternative embodiment of the present invention.

Finally, in the third method referred to as "convective removal" and shown in FIG. 7, after the reticle has been pelliclized at step 701 and completed all of its manufacturing and inspection steps, at step 703, it is transferred to a chamber where optically inert gas is routed through the interpellicle space through a frame which has been modified to receive and distribute gas while the reticle exterior is exposed to a continuous flow of gas. Additionally, either UV radiation, plasma, ozone, heat or a combination of the above is used to remove the adsorbed and absorbed species. The inert gas flows are augmented with UV or other means to drive desorption and remove all contaminants. Once again, the time of exposure will tend to depend upon the final transmission level required.

Figure 8:
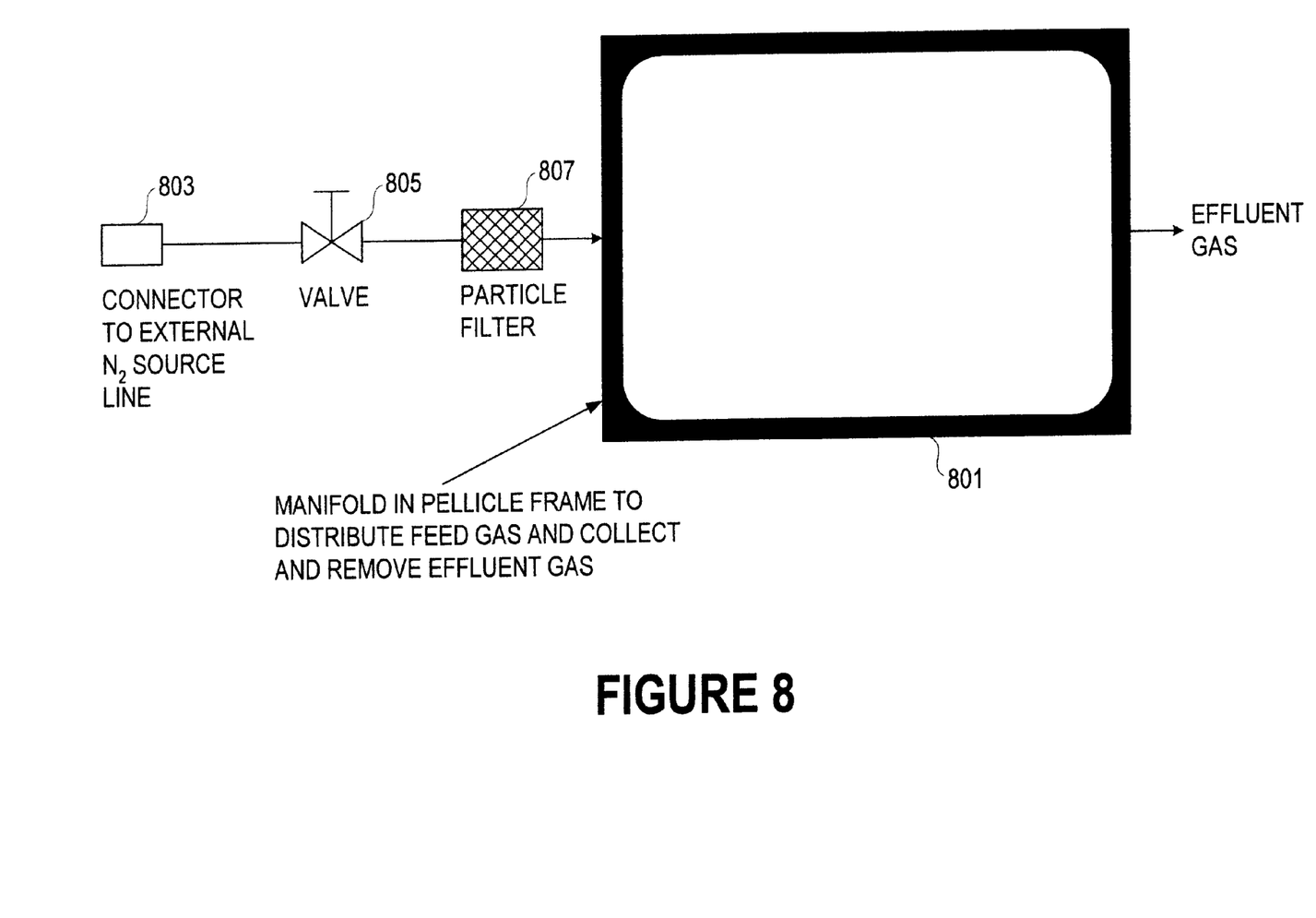
FIG. 8 is a schematic diagram of a pellicle frame used with the method of FIG. 7.

Turning to FIG. 8, a pellicle frame 801 formed in accordance with the present invention is shown. The pellicle frame 801 includes a manifold that connects a gas source 803 to the interpellicle space. The pellicle frame 801 is equipped with a valve device 805 for flow modulation and shutoff as well as a filter 807 for particulate control. The valve 805 and filter 807 replaces the traditional PRV devices.

Next, at step 705, once the target exposure time is reached, the chamber is filled with an optically inert gas, such as nitrogen, until atmospheric pressure is reached. Next, at step 707, the pelliclized reticle is moved into a mini-environment pod (such as a SMIF pod) through a robotic transfer system. In either case, the reticle is maintained in an optically inert environment.

At step 709, the reticle is maintained in an optically inert gas atmosphere during subsequent storage and shipping by means of mini-environment SMIF pods. As seen in step 709, loading onto photolithographic tools can be achieved by use of robotics systems which transfer the reticle from the SMIF pod to the tool and serve as an interface which maintains the optically inert gas environment surrounding the reticle.

While the preferred embodiment of the invention has been illustrated and described, it will be appreciated that various changes can be made therein without departing from the spirit and scope of the invention.

What is claimed is:

1. An apparatus comprising:

a carrier having a chamber; and an ionizer formed integral to said chamber for generating ions for introduction into said chamber.

2. The apparatus of claim 1 further including a first electrically charged collector placed within said chamber, said first electrically charged collector for attracting particulates within said chamber.

3. The apparatus of claim 2 further including a second electrically charged collector placed within said chamber, said second electrically charged collector having an opposite electrical charge from said first electrically charged collector, said second electrically charged collector positioned distal to said first electrically charged collector and for attracting particulates within said chamber.

\* \* \* \* \*